(12) United States Patent
Reinberg

(10) Patent No.: US 6,991,981 B2
(45) Date of Patent: *Jan. 31, 2006

(54) PROCESSING METHODS OF FORMING AN ELECTRICALLY CONDUCTIVE PLUG TO A NODE LOCATION

(75) Inventor: Alan R. Reinberg, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/884,584

(22) Filed: Jul. 1, 2004

(65) Prior Publication Data

US 2004/0241986 A1 Dec. 2, 2004

Related U.S. Application Data

(60) Division of application No. 10/382,801, filed on Mar. 5, 2003, now Pat. No. 6,777,289, which is a division of application No. 09/251,219, filed on Feb. 16, 1999, now Pat. No. 6,551,876, which is a continuation of application No. 08/808,603, filed on Feb. 28, 1997, now Pat. No. 5,872,048.

(51) Int. Cl.
H01L 21/8242 (2006.01)

(52) U.S. Cl. ............... 438/254; 438/253; 438/279; 438/397; 438/584; 438/587; 438/595; 438/672

(58) Field of Classification Search ............... 438/253, 438/254, 279, 396, 397, 584, 587, 595, 672; 257/308, 310, 306
See application file for complete search history.

(56) References Cited

U.S. PATENT DOCUMENTS

| | | | |
|---|---|---|---|
| 5,053,351 A | 10/1991 | Fazan et al. | |
| 5,084,406 A | 1/1992 | Rhodes et al. | |
| 5,296,400 A | 3/1994 | Park et al. | |
| 5,338,700 A | 8/1994 | Dennison et al. | |
| 5,340,763 A | 8/1994 | Dennison | |
| 5,354,705 A | 10/1994 | Mathews et al. | |
| 5,488,011 A | 1/1996 | Figura et al. | |
| 5,496,773 A | 3/1996 | Rhodes et al. | |
| 5,605,857 A | 2/1997 | Jost et al. | |
| 5,629,539 A * | 5/1997 | Aoki et al. | 257/306 |
| 5,773,341 A | 6/1998 | Green et al. | |
| 5,872,048 A | 2/1999 | Reinberg | |
| 5,918,122 A * | 6/1999 | Parekh et al. | 438/253 |

(Continued)

OTHER PUBLICATIONS

M. Sakao et al. "A Capacitor-Over-Bit-Line (COB) Cell with a Hemispherical-Grain Storage Node for 64Mb DRAMs", Microelectronics Research Laboratories, NEC Corporation, 1990, pp. 27.3.1-27.3.4.

(Continued)

Primary Examiner—Maria F. Guerrero
(74) Attorney, Agent, or Firm—Wells St. John, P.S.

(57) ABSTRACT

Methods of forming electrical connections with an integrated circuitry substrate node location are described. According to one aspect of the invention, a substrate node location is laterally surrounded with insulating material and left outwardly exposed. Conductive material is deposited over the exposed node location. Subsequently, a photomaskless etch of the conductive material is conducted to a degree sufficient to leave a plug of conductive material over the node location. In a preferred implementation, the insulating material with which such node location is surrounded constitutes insulating material portions which are provided relative to conductive lines which are formed over the substrate. In another preferred implementation, such conductive lines form a grid of insulating material which, in turn, defines the node location.

17 Claims, 8 Drawing Sheets

U.S. PATENT DOCUMENTS

| | | | |
|---|---|---|---|
| 6,083,831 A * | 7/2000 | Dennison | 438/666 |
| 6,127,700 A | 10/2000 | Bulucea | |
| 6,214,663 B1 | 4/2001 | Cho et al. | |
| 6,551,876 B2 | 4/2003 | Reinberg | |
| 6,777,289 B2 * | 8/2004 | Reinberg | 438/254 |

OTHER PUBLICATIONS

*Merriam Webster's Collegiate Dictionary*—10th Edition, Copyright 1996 3 pages (p. 1185).
*Merriam Webster's Collegiate Dictionary*10th Edition, Principal Copyright 1993, 2 pages (pp. 657 and 1187).

* cited by examiner

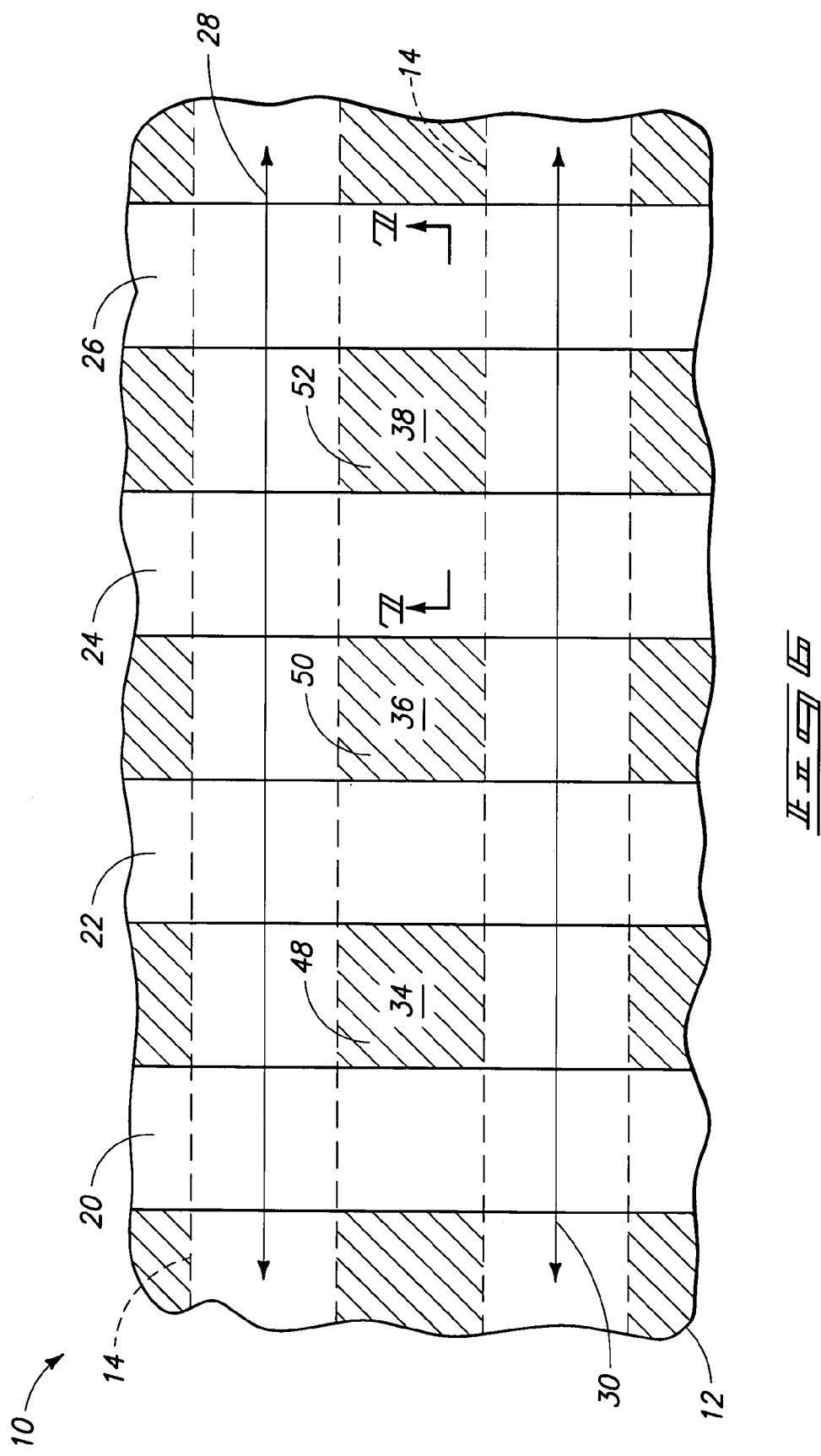

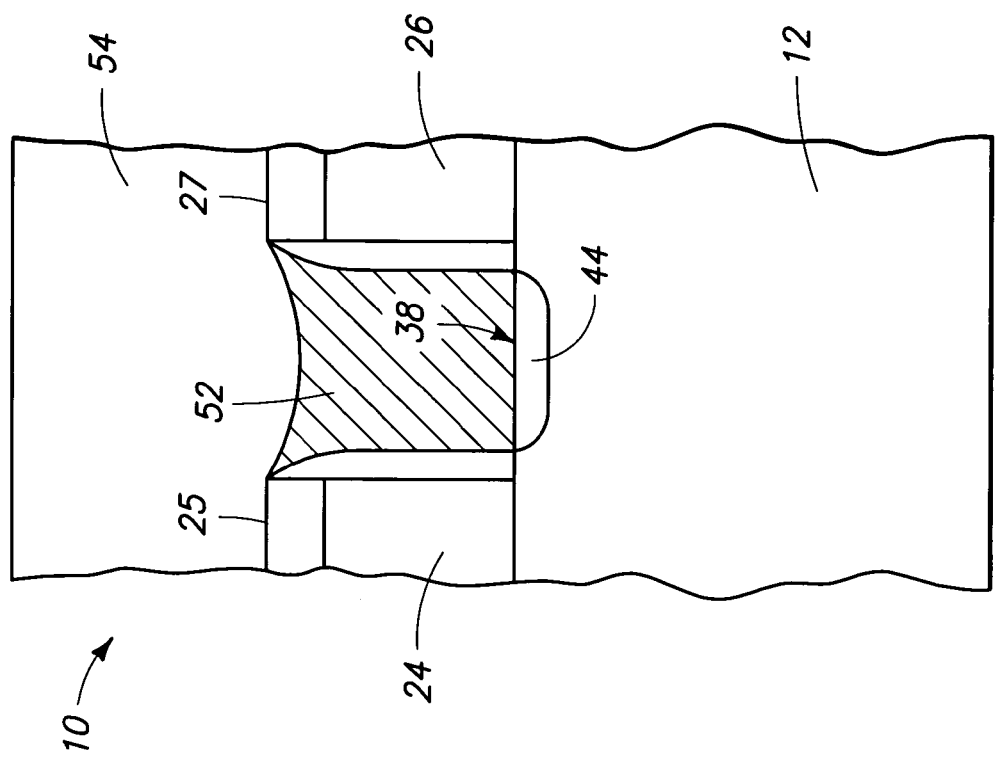
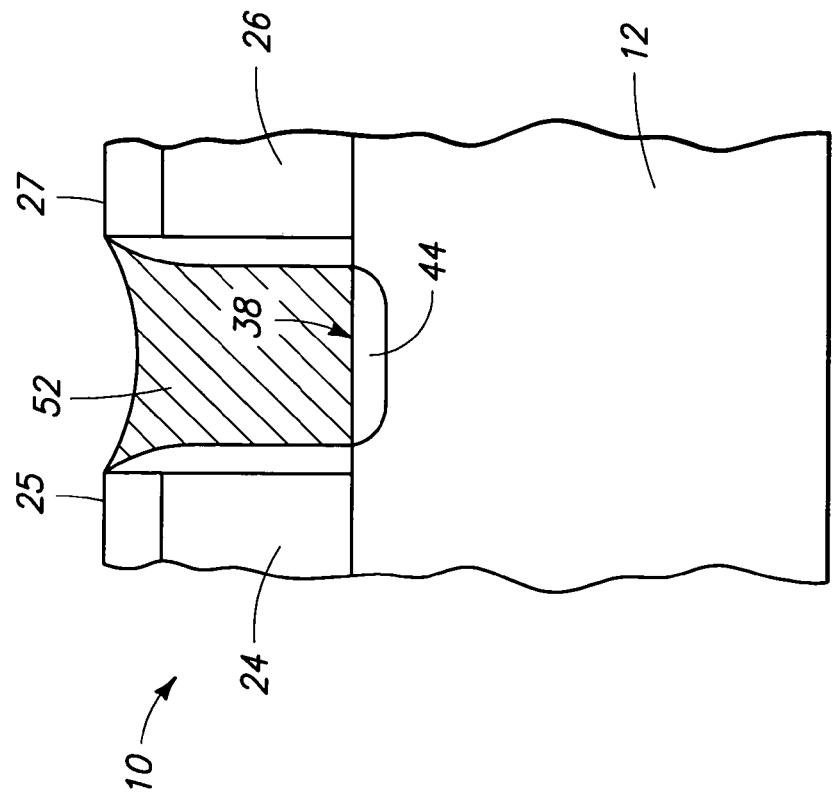

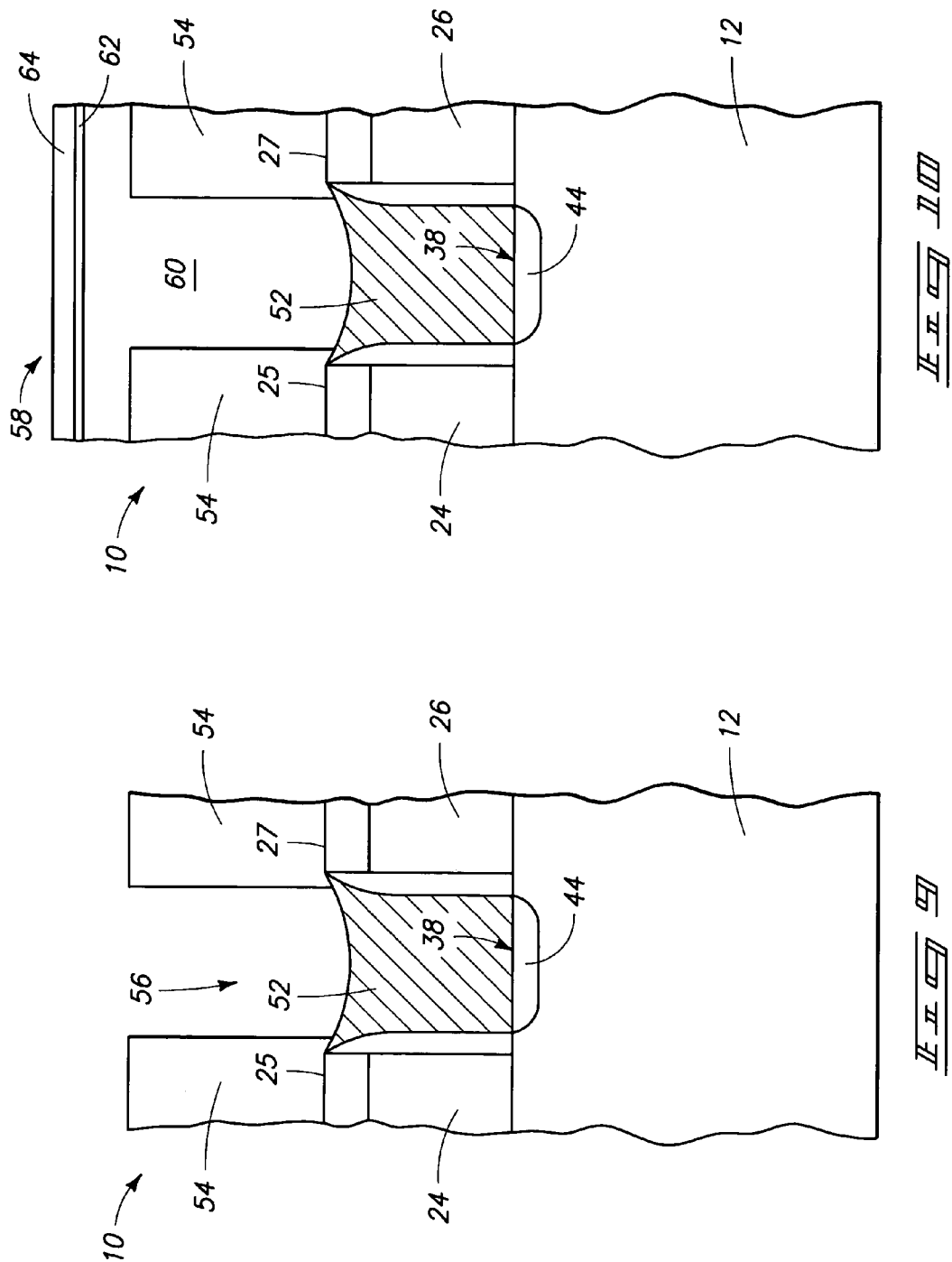

PROCESSING METHODS OF FORMING AN ELECTRICALLY CONDUCTIVE PLUG TO A NODE LOCATION

CROSS REFERENCE TO RELATED APPLICATION

This patent application is a Divisional Application of U.S. patent application Ser. No. 10/382,801, filed Mar. 5, 2003, now U.S. Pat. No. 6,777,289, entitled "Processing Methods of Forming an Electrically Conductive Plug to a Node Location," naming Alan R. Reinberg as inventor, which is a Divisional Application of U.S. patent application Ser. No. 09/251,219, filed Feb. 16, 1999, now U.S. Pat. No. 6,551,876 B2, which is a Continuation Application of U.S. patent application Ser. No. 08/808,603, filed Feb. 28, 1997, now U.S. Pat. No. 5,872,048, the disclosures of which are hereby incorporated herein by reference.

TECHNICAL FIELD

This invention concerns processing methods of forming an electrically conductive plug to a node location. This invention also concerns methods of forming an electrical connection with an integrated circuit memory cell node location.

BACKGROUND OF THE INVENTION

Fabrication of integrated circuitry typically involves forming electrical connections to substrate node locations. In the context of integrated circuit memory devices, such as dynamic random access memory devices, such electrical connections include those which are made to and between storage capacitors and substrate diffusion regions.

In the past, there have been at least two ways to make such electrical connections. A first way of forming such electrical connections involves depositing a thick insulator material, such as borophosphosilicate glass, over the substrate and then conducting a self-aligned etch thereof to form a contact opening. The contact opening, or at least a portion thereof, is subsequently filled with conductive material. As aspect ratios of such contact openings increase, it becomes more challenging to form such openings and electrical connections. A second way of forming such electrical connections involves depositing a conductive material over the entire substrate, patterning and etching such material to define desired electrical connections, and subsequently forming an insulating dielectric layer over the substrate. Contact openings can then be etched through the dielectric layer. Again, challenges are posed with respect to etching the contact openings through the dielectric layer.

This invention grew out of concerns associated with improving the manner in which electrical connections are made to or with integrated circuit substrate node locations. This invention also grew out of concerns associated with improving the manner in which electrical connections are made with integrated circuit memory cell node locations.

SUMMARY OF THE INVENTION

Methods of forming electrical connections with an integrated circuit substrate node location are described. According to one aspect of the invention, a substrate node location is laterally surrounded with insulating material and left outwardly exposed. Conductive material is deposited over the exposed node location. Subsequently, a photomaskless etch of the conductive material is conducted to a degree sufficient to leave a plug of conductive material over the node location. In a preferred implementation, the insulating material with which such node location is surrounded constitutes insulating material portions which are provided relative to conductive lines which are formed over the substrate. In another preferred implementation, such conductive lines form a grid of insulating material which, in turn, defines the node location. According to a preferred aspect of the invention, a plurality of insulated conductive lines are formed over a substrate. At least some of the conductive lines constitute word lines and at least some of the conductive lines constitute bit lines. The lines are preferably formed to define and laterally surround an active area substrate location. The substrate location is preferably surrounded by at least four of the lines. Conductive material is deposited over the substrate and the conductive lines and in electrical contact with the node location. The conductive material is then removed to a degree sufficient to form an isolated plug of conductive material over the node location and between the four conductive lines.

BRIEF DESCRIPTION OF THE DRAWINGS

Preferred embodiments of the invention are described below with reference to the following accompanying drawings.

FIG. 6 is a view of the FIG. 4 wafer fragment at a processing step subsequent to that shown by FIG. 4.

FIG. 7 is a view of a portion of the FIG. 6 wafer fragment taken along line 7—7 in FIG. 6.

FIG. 8 is a view of the FIG. 7 wafer fragment at a processing step subsequent to that shown by FIG. 7.

FIG. 9 is a view of the FIG. 7 wafer fragment at a processing step subsequent to that shown by FIG. 8.

FIG. 10 is a view of the FIG. 7 wafer fragment at a processing step subsequent to that shown by FIG. 9.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
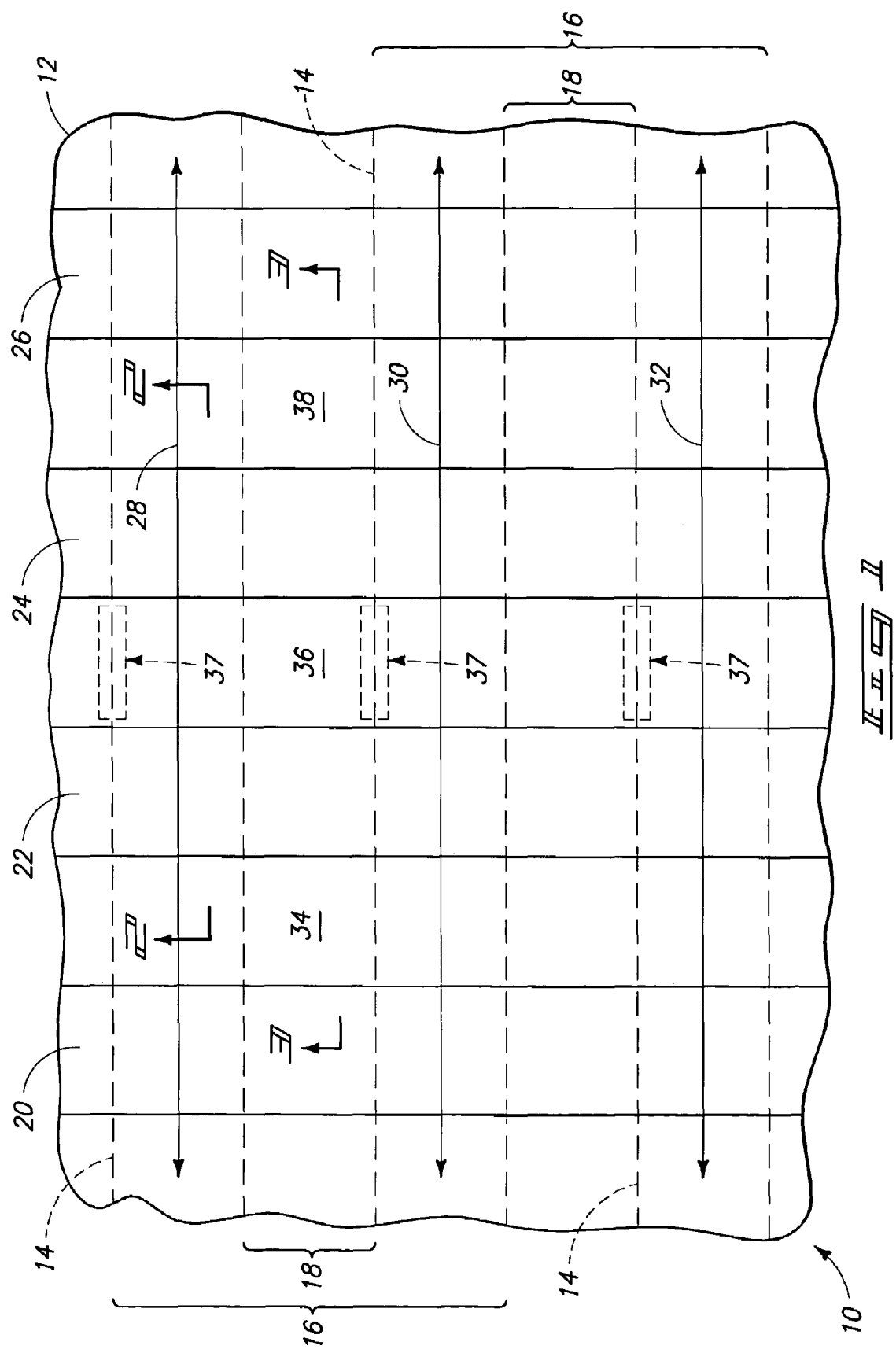
FIG. 1 is a top plan view of a semiconductor wafer fragment at one processing step in accordance with the invention.

Referring to FIG. 1, a semiconductor wafer fragment is shown generally at 10 and comprises a semiconductive substrate 12. In the context of this document, the term "semiconductive substrate" is defined to mean any construction comprising semiconductive material, including, but not limited to bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. In the preferred embodiment, substrate 12 comprises an integrated circuit memory array area and a peripheral area. For purposes of the discussion herein, only a portion of the memory array area is shown.

A plurality of isolation oxide runners 14 are formed within substrate 12. One method of forming such runners is by trench and refill techniques in which substrate portions are etched away and back-filled with isolation oxide. Subsequent planarization provides the illustrated isolation oxide runners. Respective pairs of runners such as pairs 16 define continuous active areas or regions therebetween, such as respective active areas or regions 18. Active areas or regions 18 constitute continuous active areas which are formed within or relative to substrate 12. A plurality of laterally spaced apart insulative conductive lines 20, 22, 24, and 26, at least some of which are word lines, are formed over substrate 12 and disposed generally transverse individual isolation oxide runners 14. The illustrated conductive lines are formed, in the preferred embodiment, to have respective insulative or insulating sidewall spacers (shown in FIG. 2 but not specifically designated) and insulative or insulating caps (shown in FIG. 2 but not specifically designated).

Conductive lines 20, 22, 24, and 26 constitute a first series of conductive lines which are formed relative to substrate 12. In the illustrated and preferred embodiment, substrate 12 supports integrated circuitry which forms memory cells. Even more preferably, such memory cells constitute dynamic random access memory cells. Accordingly, word line pair 22, 24 share an intervening contact of adjacent pairs of memory cells, which in turn share a diffusion region (described below) in substrate 12. Electrical isolation between the adjacent pairs of memory cells is provided by intervening conductive isolation lines 20, 26 which are formed in conjunction with the formation of word lines 22, 24. Lines 20, 26 in operation are connected with ground or a suitable negative voltage and effectively substitute for the electrical isolation formerly provided by field oxide.

Figure 2:
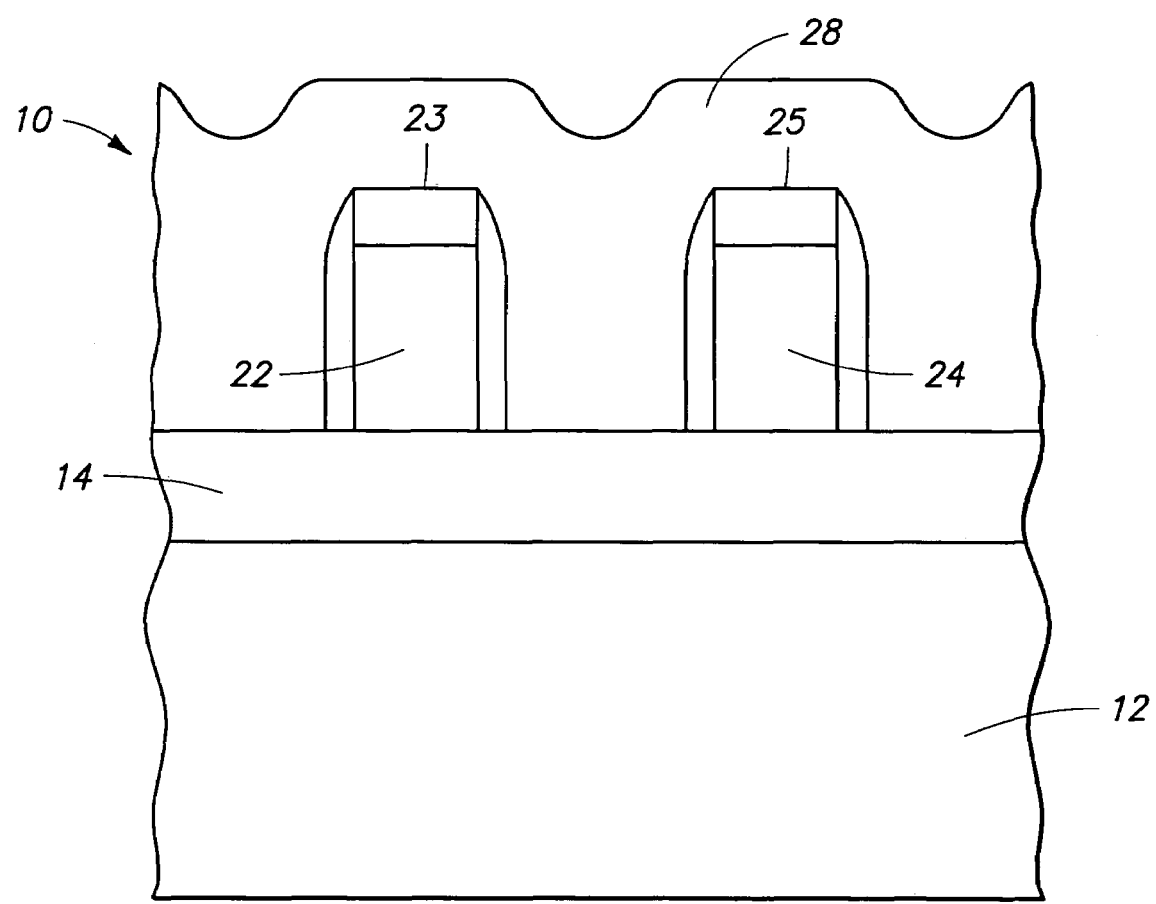
FIG. 2 is a view of the FIG. 1 wafer fragment taken along line 2—2 in FIG. 1.
Figure 3:
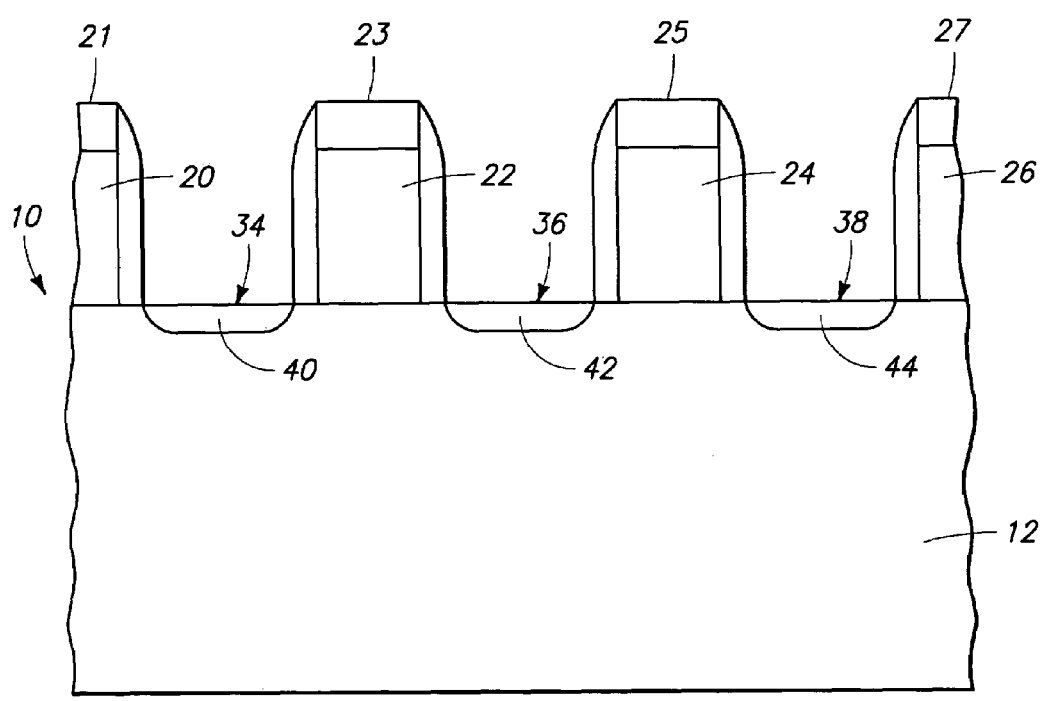
FIG. 3 is a view of the FIG. 1 wafer fragment taken along line 3—3 in FIG. 1.

Referring to FIGS. 1—3, conductive lines 20, 22, 24, and 26 have respective conductive line tops 21, 23, 25, and 27. Such line tops are defined by the insulating or insulative caps mentioned above. A plurality of laterally spaced apart insulated conductive memory cell bit lines 28, 30, and 32 are formed elevationally outwardly of conductive lines 20, 22, 24, and 26 and their respective conductive line tops, and are disposed generally transverse relative to the word lines. For purposes of illustration and clarity, the bit lines are indicated in FIG. 1 as a second series of parallel lines at least portions of which are disposed elevationally over the first series lines 20, 22, 24, and 26. In the illustrated and preferred embodiment, individual bit lines are formed elevationally over respective individual isolation oxide runners 14 as best shown in FIG. 2 for bit line 28 in corresponding extent and shape.

As formed, the first and second series of conductive lines collectively constitute a plurality of upstanding devices, with individual conductive word/isolation lines and bit lines constituting a grid of insulated lines which are formed relative to substrate 12.

Referring to FIGS. 1 and 3, a plurality of node locations 34, 36, and 38 with which electrical connections is desired are defined by the grid of upstanding and between conductive line pairs 20, 22, and 22, 24, and 24, 26 which are formed elevationally outwardly thereof. Although only three node locations are shown for purposes of illustration, other node locations are formed over the array defined by substrate 12. In the illustrated and preferred embodiment, node locations 34, 36, and 38 constitute respective diffusion regions 40, 42, and 44 which are outwardly exposed. As formed, node locations 34, 36, and 38 also constitute first substrate locations which are collectively laterally and completely surrounded with insulating material. In the illustrated example, such insulating material constitutes insulative portions of first series conductive lines 20, 22, 24, and 26, and second series conductive bit line 28, 30, and 32 which are formed elevationally outwardly of and generally transverse relative to conductive lines 20, 22, 24, and 26. In the illustrated and preferred embodiment, the conductive word/isolation and bit lines are formed to define an adjacent active area substrate location (corresponding to respective node locations 34, 36, and 38) which is laterally surrounded by four of the insulated conductive lines. In this example, two of such lines constitute first series lines, and two of such lines constitute second series lines. As used herein, the term "surround" is defined to mean "to enclose on all sides."

In the illustrated example, a mask can and preferably is utilized to define and expose a plurality of areas 37 (FIG. 1) proximate respective bit lines 28, 30, and 32. Areas 37 constitute areas which laterally expose respective sidewall spacers over the diagrammatically illustrated bit lines 28, 30, and 32. Typically, such sidewall spacers are formed from an oxide or nitride material. In a preferred embodiment, the sidewall spacers of conductive lines 20, 22, 24, and 26 comprise a nitride material while those of bit lines 28, 30, and 32 comprise an oxide material. The exposed sidewall portions 37 of bit lines 28, 30, and 32 are etched in a wet etch comprising HF at a substantially higher rate than the nitride material sidewalls of conductive lines 20, 22, 24, and 26. Accordingly, such enables contact to be made relative to the bit lines without appreciably etching any inadvertently exposed sidewall material of conductive lines 20, 22, 24, and 26.

Figure 4:
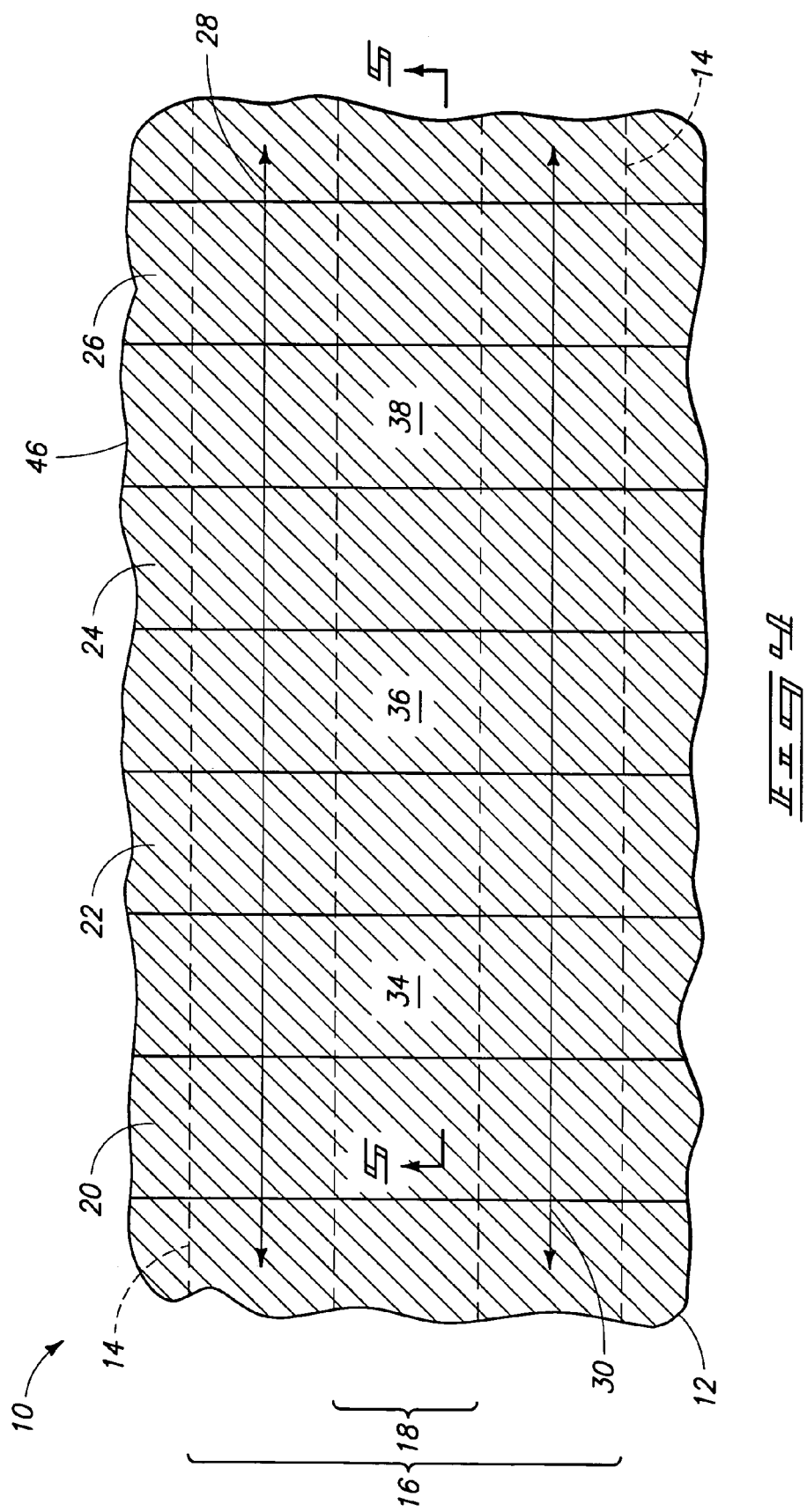
FIG. 4 is a view of a portion of the FIG. 1 wafer fragment at a processing step subsequent to that shown by FIG. 1.
Figure 5:
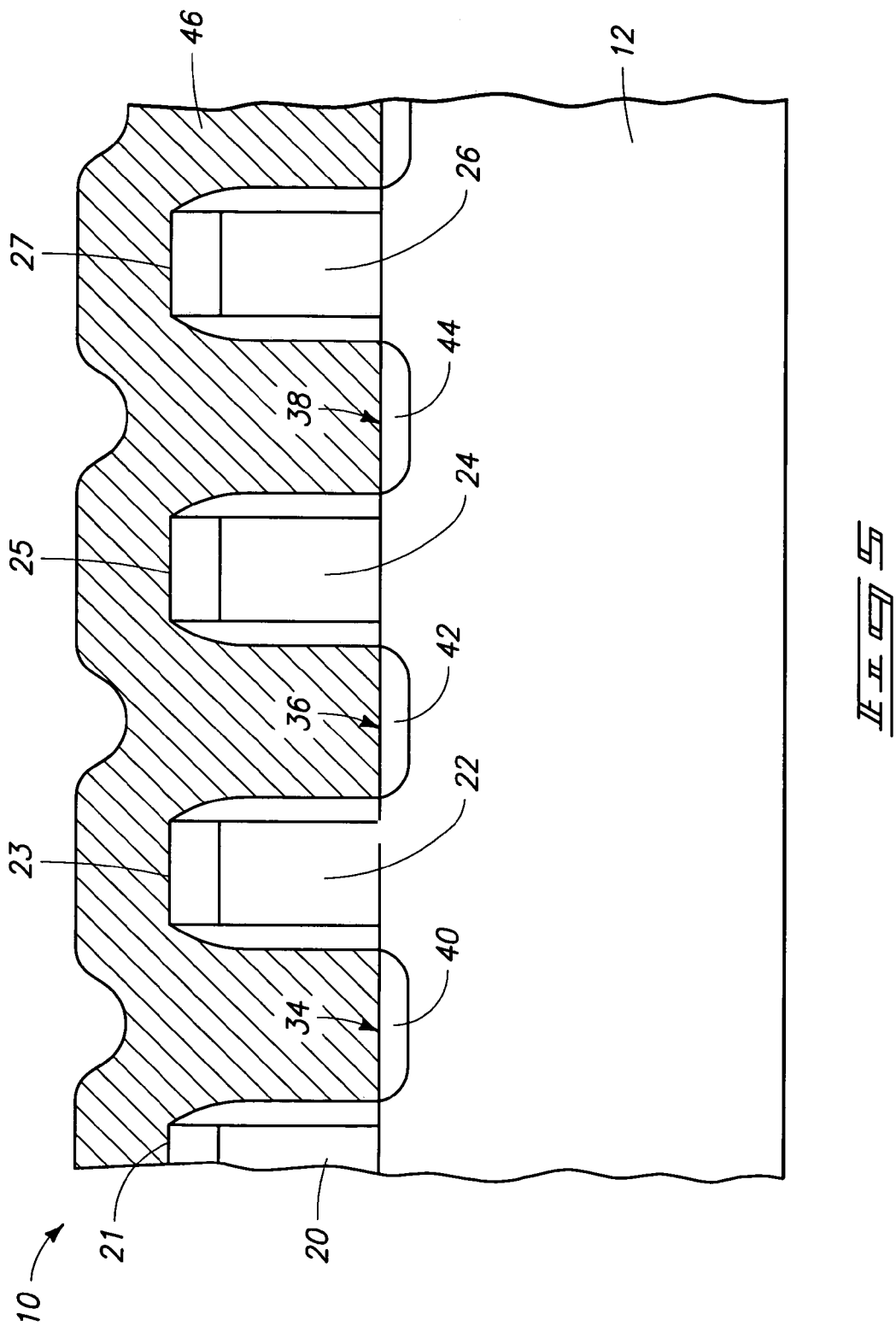
FIG. 5 is a view of the FIG. 4 wafer fragment taken along line 5—5 in FIG. 4.

Referring to FIGS. 4 and 5, a fragmentary portion of the FIG. 1 substrate is shown. After node locations 34, 36, and 38 are surrounded with the preferred insulating material and with the bit line conductive sidewall portions being effectively exposed, conductive material 46 is formed or deposited over the grid and the exposed node locations. Exemplary materials for conductive material 46 are polysilicon, tungsten, and the like. Preferably, such conductive material is chemical vapor deposited to achieve a degree of conformal coverage. Accordingly, conductive material 46 is deposited over the conductive lines and in electrical connection with the respective node locations as shown in FIG. 5. Conductive material 46 is also preferably in contact with the exposed portions of the bit line sidewalls corresponding to areas 37 (FIG. 1), thereby forming an electrical connection with node location 36, which, in turn, will form a connection through a word line/gate with a storage node location described below. In the preferred embodiment, a desired amount of conductive material can be less than the height of adjacent conductive lines, but an amount which is sufficient to fill the spaces between the lines.

Referring to FIGS. 6 and 7, conductive material 46 is removed to a degree sufficient to form isolated plugs 48, 50, and 52 of conductive material (FIG. 6) respectively, over node locations 34, 36, and 38. Plug 52 is shown in its cross-sectional entirety in FIG. 7. In the illustrated and preferred embodiment, a photomaskless etch is conducted of conductive material 46 (FIG. 5) to a degree which is sufficient to remove the conductive material from elevationally outward of the insulating material constituting portions of the conductive lines, and to a degree which is sufficient to leave plugs 48, 50, and 52 over is respective node locations 34, 36, and 38. Accordingly, the photomaskless etch constitutes an etch which is conducted in the absence of any photomasking material laterally proximate the node location. Even more preferably, such etch is conducted in the absence of any photomasking material over the substrate. The photomaskless etch desirably permits conductive material to be removed from outside or outwardly of the illustrated array area without the need for a mask in or over the array area. The preferred etching of conductive material 46 constitutes an isotropic etch of the material to a degree sufficient to completely remove conductive material from over the conductive word/isolation lines, and to expose the insulating material portions of lines 24, 26. Exemplary etches include wet or dry etches, with the latter being preferred. Further, exemplary dry etch chemistries can include one or more of the following: $CF_4$, $SF_6$, or $NF_3$. Accordingly, the conductive material constituting plug 52 is preferably recessed to elevationally below uppermost surfaces or line tops 25, 27.

Referring to FIG. 8, a layer 54 is formed over substrate 12. Preferably, layer 54 comprises an insulating or insulative material such as borophosphosilicate glass which is formed over the substrate. An exemplary thickness for layer 54 is 0.5 $\mu$m to 1.5 $\mu$m.

Referring to FIG. 9, an opening 56 is etched or otherwise formed through insulative layer 54 to outwardly expose conductive material of plug 52 overlying node location 38. Preferably such opening is anisotropically etched to outwardly expose plug 52.

Referring to FIG. 10, a second, spaced apart substrate location 58 is formed elevationally outward of and in electrical contact with the first substrate location defined by node location 38. In the illustrated and preferred embodiment, the spaced apart first and second substrate locations constitute part of an integrated circuitry memory cell and substrate location 58 constitutes a storage capacitor having a storage node 60, a dielectric layer 62, and cell plate 64. In the illustrated example, at least a portion of the storage capacitor is disposed elevationally outwardly, above or over the previously formed bit lines 28, 30, and 32 (FIG. 1). Accordingly, such constitutes a capacitor-over-bit-line dynamic random access memory cell. Other integrated circuit first and second substrate locations are possible, including ones which are not necessarily associated with the above described integrated circuit memory cells.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming an electrically conductive plug to a node location comprising:
   providing a node location to which electrical connection is to be made;
   forming a plurality of conductive lines having at least some of which laterally surround the node location;
   depositing conductive material over the surrounded node location and in electrical contact therewith; and
   removing at least some of the conductive material to leave a plug of conductive material over the node location.

2. The method of claim 1, wherein the forming of the plurality of conductive lines comprises performing the forming in separate steps.

3. The method of claim 1, wherein the forming of the plurality of conductive lines comprises forming at least one of the conductive lines at a first substrate elevation, and forming at least another of the conductive lines at a different substrate elevation.

4. The method of claim 1, wherein the forming of the plurality of conductive lines comprises:
   forming a first conductive line having individual insulative sidewall spacers, one of which abuts the node location on a first side thereof;
   forming a second conductive line having individual insulative sidewall spacers, one of which abuts the node location on a second side thereof, the second side being opposed to the first side;
   forming a third conductive line having individual insulative sidewall spacers, one of which abuts the node location and extends at least from the sidewall spacer abutting the first side to the second side; and
   forming a fourth conductive line having individual insulative sidewall spacers, one of which abuts the node location and extends at least from the sidewall spacer abutting the first side to the sidewall spacer abutting the second side on an opposed side of the node from the third conductive line.

5. The method of claim 1, wherein the forming of the plurality of conductive lines comprises:
   forming a first pair of conductive lines to extend along a first direction; and
   forming a second pair of the conductive lines to extend along a second direction.

6. The method of claim 5, wherein the first and second pairs of conductive lines extend in different direction.

7. The method of claim 5, wherein the first and second pairs of conductive lines extend in directions which are generally orthogonal to one another.

8. The method of claim 5, wherein the first and second pairs of conductive lines are formed at different substrate elevations relative to one another.

9. A method of forming an electrically conductive plug to a node location comprising:
   providing a node location to which electrical connection is to be made;
   forming a first pair of conductive lines adjacent the node location, at least portions of the first of conductive lines being insulated with a first insulating material;
   forming a second pair of conductive lines over the first pair of conductive lines proximate the node location, at least portions of the second pair of conductive lines being insulated with a second insulating material;
   opening a window over the node location and a portion of one of the conductive lines of the second pair of conductive lines;
   removing material within the window, including at least some of the second insulating material which insulates the one conductive line sufficient to expose some conductive material of the one conductive line; and
   forming conductive plug over the node location and the exposed conductive material of the one conductive line.

10. The method of claim 9, wherein the forming of the first pair of conductive lines and the forming of the second pair of conductive lines over the first pair of conductive lines comprises enclosing the node location on all sides.

11. The method of claim 9, wherein the forming of the first pair of conductive lines and the forming of the second pair of conductive lines over the first pair of conductive lines comprises enveloping the node location.

12. A method of forming an electrically conductive plug to a node location comprising:

forming a first conductive line over a substrate and adjacent a node location with which electrical connection is to be made;

forming a second conductive line proximate the first conductive line;

forming a third conductive line proximate the second conductive line;

forming a fourth conductive line proximate the third conductive line; wherein the first, second, third, and fourth conductive lines are arranged to laterally surround the node location; and forming a conductive plug over the substrate and in electrical contact with the node location.

13. The method of claim 12, wherein the first and second conductive lines are formed at the same time.

14. The method of claim 12, wherein the third and fourth conductive lines are formed at the same time.

15. The method of claim 12, wherein the first and second conductive lines are formed at the same time, and the third and fourth conductive lines are formed at a time which is different from the time at which the first and second conductive lines are formed.

16. The method of claim 12 further comprising prior to forming the conductive plug over the substrate:

opening a window over one of the third and fourth conductive lines which also overlaps with a portion of the node location; and removing material within window sufficient to expose a conductive portion of the one conductive line; and wherein the forming of the conductive plug comprises placing the exposed conductive portion of the one conductive line into electrical communication with the node location.

17. The method of claim 12 further comprising providing insulating material wherein the first, second, third, and fourth conductive lines are arranged to laterally surround the node location with insulating material.

* * * * *

UNITED STATES PATENT AND TRADEMARK OFFICE
CERTIFICATE OF CORRECTION

PATENT NO. : 6,991,981 B2
APPLICATION NO. : 10/884584
DATED : January 31, 2006
INVENTOR(S) : Reinberg Page 1 of 1

It is certified that error appears in the above-identified patent and that said Letters Patent is hereby corrected as shown below:

Col. 3, line 61, please insert --devices-- after "upstanding".

Col. 3, line 65, please insert --area-- after "array".

Col. 6, line 47, claim 9, please insert --pair-- after "first".

Signed and Sealed this

Tenth Day of April, 2007

JON W. DUDAS
*Director of the United States Patent and Trademark Office*